(12) United States Patent
Alzate Vinasco et al.

(10) Patent No.: US 11,950,407 B2
(45) Date of Patent: Apr. 2, 2024

(54) MEMORY ARCHITECTURE WITH SHARED BITLINE AT BACK-END-OF-LINE

(71) Applicant: Intel Corporation, Santa Clara, CA (US)

(72) Inventors: Juan G. Alzate Vinasco, Tigard, OR (US); Travis W. Lajoie, Forest Grove, OR (US); Abhishek A. Sharma, Hillsboro, OR (US); Kimberly L Pierce, Beaverton, OR (US); Elliot N. Tan, Portland, OR (US); Yu-Jin Chen, Hillsboro, OR (US); Van H. Le, Portland, OR (US); Pei-Hua Wang, Beaverton, OR (US); Bernhard Sell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 861 days.

(21) Appl. No.: 16/828,507

(22) Filed: Mar. 24, 2020

(65) Prior Publication Data

US 2021/0305255 A1 Sep. 30, 2021

(51) Int. Cl.
*H10B 12/00* (2023.01)
*H01L 23/522* (2006.01)
*H01L 23/528* (2006.01)
*H01L 49/02* (2006.01)

(52) U.S. Cl.
CPC ....... *H10B 12/315* (2023.02); *H01L 23/5226* (2013.01); *H01L 23/528* (2013.01); *H01L 28/91* (2013.01); *H10B 12/0335* (2023.02); *H10B 12/05* (2023.02); *H10B 12/318* (2023.02); *H10B 12/482* (2023.02); *H10B 12/485* (2023.02)

(58) Field of Classification Search
CPC H10B 12/315; H10B 12/482; H10B 12/0335; H10B 12/05; H10B 12/485; H10B 12/318; H01L 23/5226; H01L 23/528; H01L 28/91
USPC ....................................................... 257/296
See application file for complete search history.

(56) References Cited

U.S. PATENT DOCUMENTS

| 2004/0222529 A1* | 11/2004 | Dostalik | H01L 21/76831 257/E23.145 |
| 2008/0211002 A1 | 9/2008 | Nakamura et al. | |
| 2018/0090498 A1 | 3/2018 | Onuki et al. | |

(Continued)

OTHER PUBLICATIONS

Search Report for European Patent Application No. 20215504.0, dated May 18, 2021, 8 pgs.

*Primary Examiner* — Tu-Tu V Ho
(74) *Attorney, Agent, or Firm* — Schwabe, Williamson & Wyatt, P.C.

(57) ABSTRACT

Embodiments herein describe techniques for a memory device including at least two memory cells. A first memory cell includes a first storage cell and a first transistor to control access to the first storage cell. A second memory cell includes a second storage cell and a second transistor to control access to the second storage cell. A shared contact electrode is shared between the first transistor and the second transistor, the shared contact electrode being coupled to a source area or a drain area of the first transistor, coupled to a source area or a drain area of the second transistor, and further being coupled to a bit line of the memory device. Other embodiments may be described and/or claimed.

23 Claims, 11 Drawing Sheets

(56) References Cited

U.S. PATENT DOCUMENTS

2019/0172921 A1\* 6/2019 Dewey .............. H01L 23/53204
2019/0393224 A1  12/2019 Wang et al.

\* cited by examiner

MEMORY ARCHITECTURE WITH SHARED BITLINE AT BACK-END-OF-LINE

FIELD

Embodiments of the present disclosure generally relate to the field of integrated circuits, and more particularly, to memory devices.

BACKGROUND

Memory devices are important parts of integrated circuits (IC) and modern electronic devices. A memory device, e.g., a dynamic random access memory (DRAM) array, may include a plurality of memory cells, where a memory cell may include a selector, e.g., a transistor, to control the access to a storage cell. When a silicon transistor is used as a selector, the silicon transistor may be very leaky, which may bring adverse impact to the performance of the storage cell.

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs in the back-end, while leaving the silicon substrate areas for high-speed transistors. A TFT may be used as a selector for a memory cell in a memory device, e.g., a DRAM device. However, current designs and implementations of memory devices, e.g., DRAM devices, still face many challenges.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
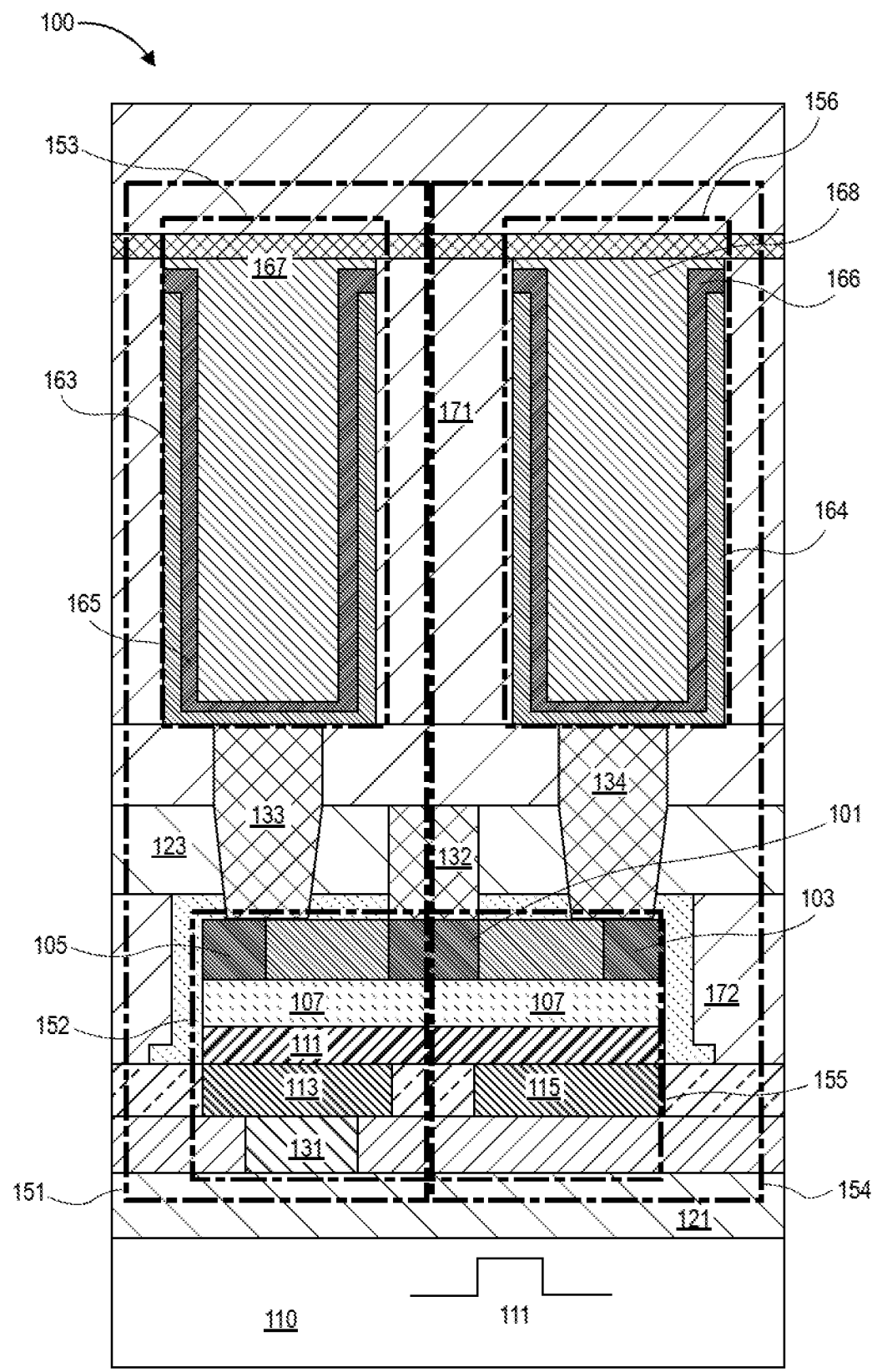
FIGS. 1(a)-1(c) schematically illustrate diagrams of a memory device including at least two memory cells with a shared contact electrode coupled to a bit line of the memory device, in accordance with some embodiments.

Memory devices are important parts of integrated circuits (IC) and semiconductor devices. High density or high bandwidth memory devices may be particularly useful for many applications, e.g., graphics, artificial intelligence, machine learning, or compute in or near memory. Dynamic random access memory (DRAM), or an enhanced or embedded dynamic random access memory (eDRAM), may be one of the leading candidates for high density or high bandwidth memory devices. A memory device, e.g., a DRAM or an eDRAM, may include a plurality of memory cells, wherein a memory cell may include a selector, e.g., a transistor, to control the access to a storage cell. In embodiments, the storage cell may be a capacitor to store charge, resulting in a 1T1C (one transistor, one capacitor) architecture for the memory cell. In detail, the capacitor can either be charged or discharged; these two states are taken to represent the two values of a bit, conventionally called 0 and 1. Accessing a memory cell may refer to read the state, e.g., charged or discharged, of the capacitor, or to change a state, e.g., store data, of the capacitor. To store data, a voltage is applied to charge or discharge the memory cell storage capacitor to the desired state. Accessing a memory cell may also refer to any other memory operations to be performed on the memory cell.

Front-end-of-line (FEOL) semiconductor processing and structures may refer to a first portion of IC fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). Back end of line (BEOL) semiconductor processing and structures may refer to a second portion of IC fabrication where the individual devices (e.g., transistors, capacitors, resistors, etc.) are interconnected with wiring on the wafer, e.g., the metallization layer or layers. BEOL includes metal contacts, dielectrics layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL. A thin film transistor (TFT) is a kind of field-effect transistor formed at BEOL and including a channel layer, a gate electrode, and source and drain electrodes, over a supporting but non-conducting substrate.

Memory devices may be implemented with capacitor over bit (COB) at BEOL. However, conventional implementations of memory devices may face some problems, e.g., large memory cells and low memory density. For example, some current memory devices use a back-gated BEOL access transistor where each bitcell has an unique drain electrode connected to a bit line and an unique source electrode connected to the capacitor COB, resulting in a so-called $8F^2$ architecture, where F is the feature size of the bitcell.

Embodiments herein presents a memory architecture with smaller memory cells and improved memory density. For example, a way to increase the density of a memory device is by moving into a $6F^2$ architecture, which in principle can scale the bitcell by 25% even when keeping F constant in the process. In embodiments, two adjacent transistors of two memory cells share the drain electrode connection to the bit line, forming a single mesa of thin film semiconductor material. Controlling the access to either COB1 or COB2 (two individual bits) is obtained by unique gating of the area beneath each transistor, which is controlled by unique back gate coupled to word lines (WLs). Adjacent transistors have separately patterned metal gate areas, which are accessed by shallow vias and individual metal WL in the back-gate. Sharing the drain electrode and the bit line of the control transistor of two adjacent memory cells can save the area of one drain electrode and one gap space between two transistors. As a result, the area density of a bitcell can be improved by about 25% without scaling the minimum feature size F. In addition, the pitch of the bit line may be relaxed since it moves from 1 bit line per COB pitch to 1 bit line per every two COB pitches.

Embodiments herein present a memory device including at least two memory cells. A first memory cell includes a first storage cell and a first transistor to control access to the first storage cell. A second memory cell includes a second storage cell and a second transistor to control access to the second storage cell. A shared contact electrode is shared between the first transistor and the second transistor, the shared contact electrode being coupled to a source area or a drain area of the first transistor, coupled to a source area or a drain area of the second transistor, and further being coupled to a bit line of the memory device.

Embodiments herein present a memory device including at least two memory cells, where a first memory cell includes a first transistor and a first capacitor, and a second memory cell includes a second transistor and a second capacitor. The first transistor includes a first gate electrode, a first contact electrode, and a shared contact electrode, where the shared contact electrode is coupled to a source area or a drain area of the first transistor, and further coupled to a bit line. The first gate electrode is coupled to a first word line. The first capacitor is coupled to the first contact electrode. The second transistor includes a second gate electrode, a second contact electrode, and the shared contact electrode, where the shared contact electrode is coupled to a source area or a drain area of the second transistor. The second gate electrode is coupled to a second word line. The second capacitor is coupled to the second contact electrode. A channel layer is shared between the first transistor and the second transistor, where the first gate electrode and the second gate electrode are located at a first side of the channel layer, and the first contact electrode, the shared contact electrode, and the second contact electrode are located at a second side of the channel layer opposite to the first side.

Embodiments herein present a method for forming a memory device. The method includes forming a first transistor and a second transistor. The first transistor includes a first gate electrode, a first contact electrode, and a shared contact electrode, where the shared contact electrode is coupled to a source area or a drain area of the first transistor. The first gate electrode is coupled to a first word line by a first via. The second transistor includes a second gate electrode, a second contact electrode, and the shared contact electrode. The shared contact electrode is coupled to a source area or a drain area of the second transistor. The second gate electrode is coupled to a second word line by a second via. The method further includes forming a bit line above the first transistor and the second transistor, and coupled to the shared contact electrode; and forming a first capacitor via in contact with the first contact electrode, and forming a second capacitor via in contact with the second contact electrode. In addition, the method includes forming a first capacitor in contact with the first capacitor via, and forming a second capacitor in contact with the second capacitor via.

Embodiments herein present a computing device, which includes a circuit board, and a memory device coupled to the circuit board. In more detail, the memory device includes a memory array. The memory array includes at least two memory cells. A first memory cell includes a first storage cell and a first transistor to control access to the first storage cell. A second memory cell includes a second storage cell and a second transistor to control access to the second storage cell. A shared contact electrode is shared between the first transistor and the second transistor, the shared contact electrode being coupled to a source area or a drain area of the first transistor, and coupled to a source area or a drain area of the second transistor, and further being coupled to a bit line of the memory array.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
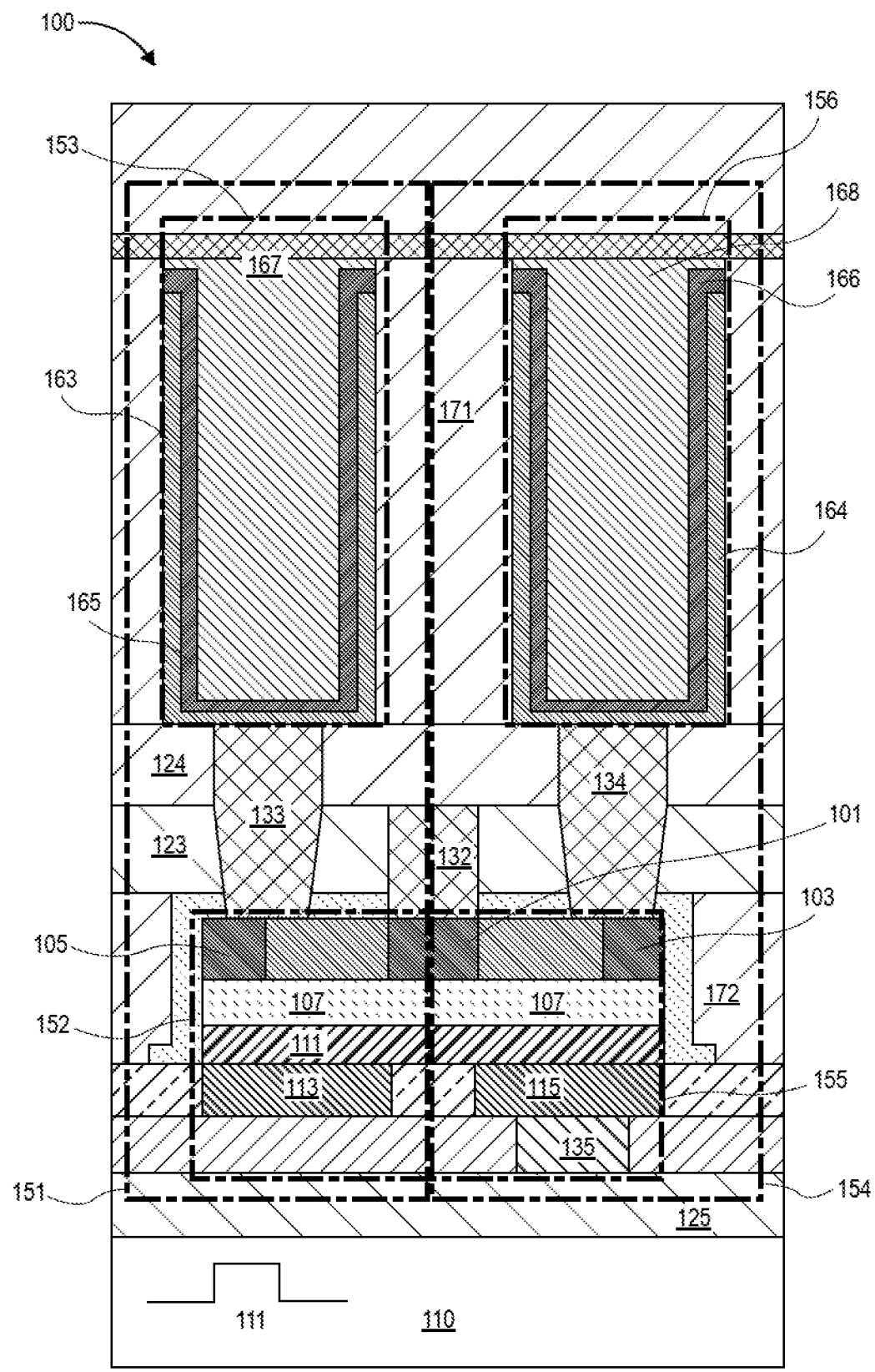
Figure 1C:
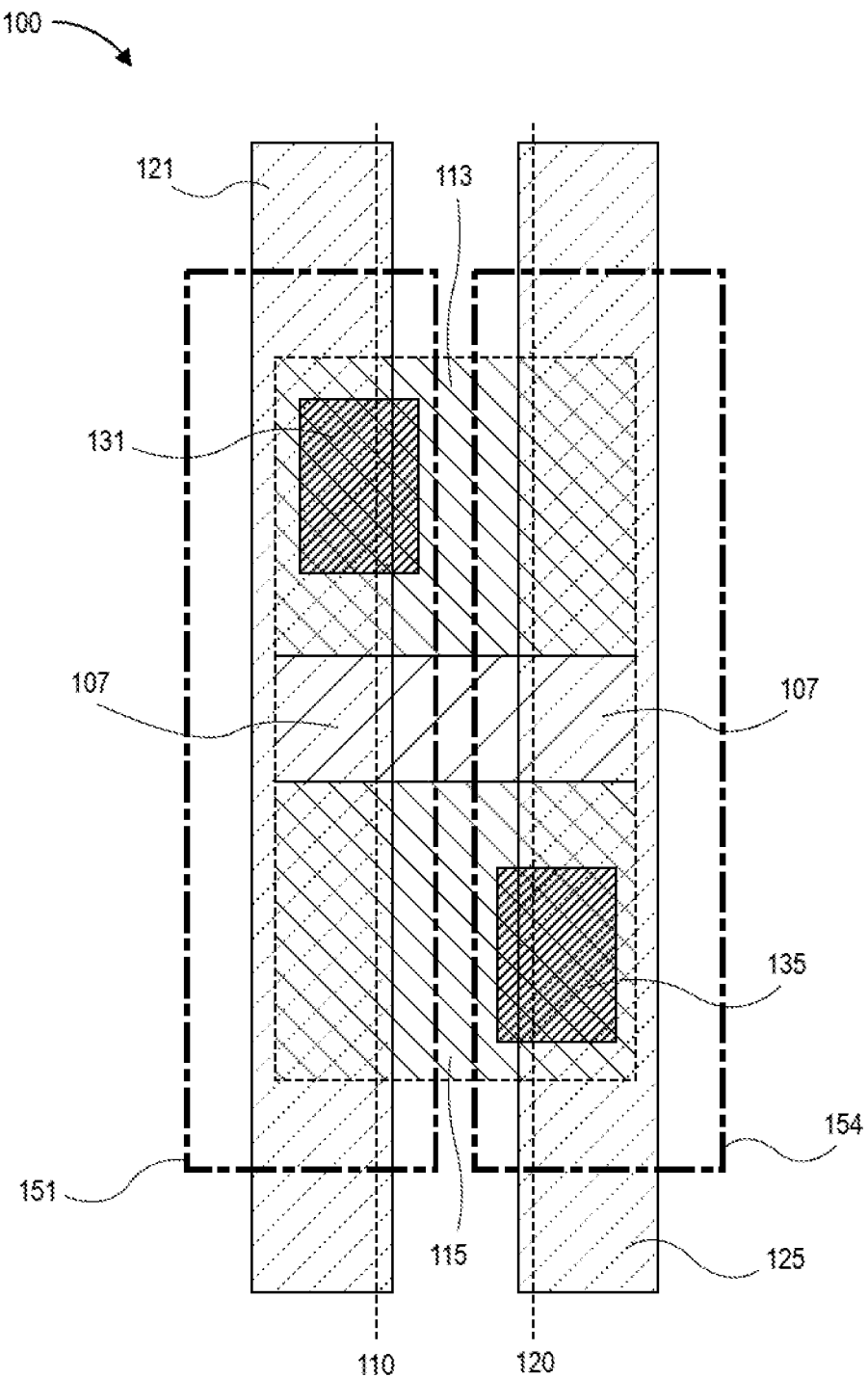

FIGS. 1(a)-1(c) schematically illustrate diagrams of a memory device 100 including at least two memory cells, e.g., a first memory cell 151 and a second memory cell 154, with a shared contact electrode 101 coupled to a bit line 132 of the memory device, in accordance with some embodiments. FIG. 1(a) and FIG. 1(b) show the memory device 100 in a cross section view, while FIG. 1(c) shows the memory device 100 in top down view. FIG. 1(a) is the cross section view along line 110 in FIG. 1(c), while FIG. 1(b) is the cross section view along line 120 in FIG. 1(c).

In embodiments, the semiconductor device 100 includes a substrate 110. A FEOL transistor 111 may be formed within the substrate 110. In addition, the memory device includes the first memory cell 151 and the second memory cell 154 formed at BEOL above the substrate 110. For example, the first memory cell 151 and the second memory cell 154 are within an interconnect structure that is above the substrate 110. The first memory cell 151 includes a first storage cell and a first transistor 152 to control access to the first storage cell. In some embodiments, the first storage cell may be a first capacitor 153. The second memory cell 154 includes a second storage cell and a second transistor 155 to control access to the second storage cell. In some embodiments, the second storage cell may be a second capacitor 156. The shared contact electrode 101 is shared between the first transistor 152 and the second transistor 155. The first transistor 152 and the second transistor 155 may be within an ILD layer 172. The shared contact electrode 101 is coupled to a source area or a drain area of the first transistor 152, and is coupled to a source area or a drain area of the second transistor 155, and further being coupled to the bit line 132.

In embodiments, the first transistor 152 includes a first gate electrode 113, a first contact electrode 105, and the shared contact electrode 101. The shared contact electrode 101 is coupled to a source area or a drain area of the first transistor 152, and further coupled to the bit line 132, where the bit line 132 is through an etch stop layer 123. The first gate electrode 113 is coupled to a first word line 121 by a via or a short via 131. The first capacitor 153 is coupled to the first contact electrode 105. The first capacitor 153 includes a first plate 163 and a second plate 167 separated from the first plate 163 by a first dielectric material 165. The first capacitor 153 is embedded within an ILD layer 171. The first plate 163 may be coupled to the first contact electrode 105 through a via 133, where the via 133 may go through the etch stop layer 123 and a second etch stop layer 124.

In embodiments, the second transistor 155 includes a second gate electrode 115, a second contact electrode 103, and the shared contact electrode 101. The shared contact electrode 101 is coupled to a source area or a drain area of the second transistor 155, and further coupled to the bit line 132. The second gate electrode 115 is coupled to a second word line 125 through a via or a short via 135. In some embodiments, the first word line 121 and the second word line 125 are located in a same metal layer at back end of the line. In some embodiments, the shared contact electrode 101 may be located in a first metal layer, and the first gate electrode 113 or the second gate electrode 115 may be located in a second metal layer, and the second metal layer is separated from the first metal layer by an ILD layer, e.g., the ILD layer 172.

In embodiments, the second capacitor 156 is coupled to the second contact electrode 103. The second capacitor 156 includes a third plate 164 and a fourth plate 168 separated from the third plate 164 by a second dielectric material 166. The fourth plate 168 of the second capacitor 156 may be coupled to the second plate 167 of the first capacitor 153. The second capacitor 156 is embedded within the ILD layer 171. The third plate 164 may be coupled to the second contact electrode 103 through a via 134.

In embodiments, a channel layer 107 is shared between the first transistor 152 and the second transistor 155. The first gate electrode 113 and the second gate electrode 115 are located at a first side of the channel layer 107, and the first contact electrode 105, the shared contact electrode 101, and the second contact electrode 103 are located at a second side of the channel layer 107 opposite to the first side. The channel layer 107 includes a first channel area separating the shared contact electrode 101 and the first gate electrode 113, and a second channel area separating the shared contact electrode 101 and the second gate electrode 115, where the first channel area and the second channel area form the channel layer 107 that is a continuous channel area. A gate dielectric layer, e.g., a high-k layer 111, may be located between the channel layer 107 and the first gate electrode 113 or the second gate electrode 115.

In embodiments, the substrate 110 may include a material selected from the group consisting of a silicon substrate, a glass substrate, a metal substrate, and a plastic substrate. The ILD layers, e.g., the ILD layer 171 and the ILD layer 172 may include a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass. The shared contact electrode 101 may include a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, InOx, HfOx, AlOx, or InAlO.

In embodiments, the channel layer 107 may include a material selected from the group consisting of $CuS_2$, $CuSe_2$, WSe$_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, Si$_2$BN, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Figure 2A:
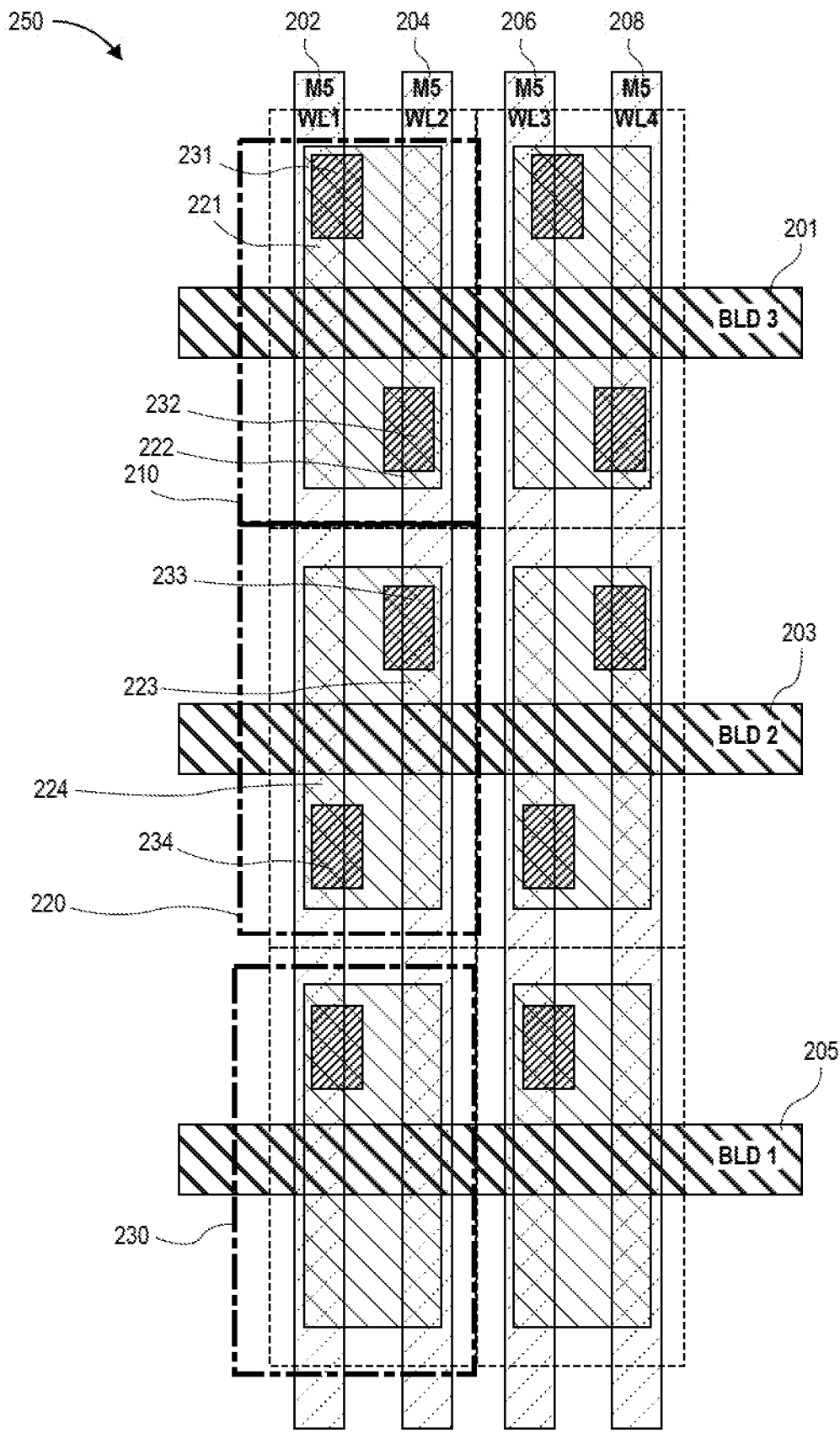
FIGS. 2(a)-2(b) schematically illustrate diagrams of a memory device including at least two memory cells with a shared contact electrode coupled to a bit line of the memory device, in accordance with some embodiments.
Figure 2B:
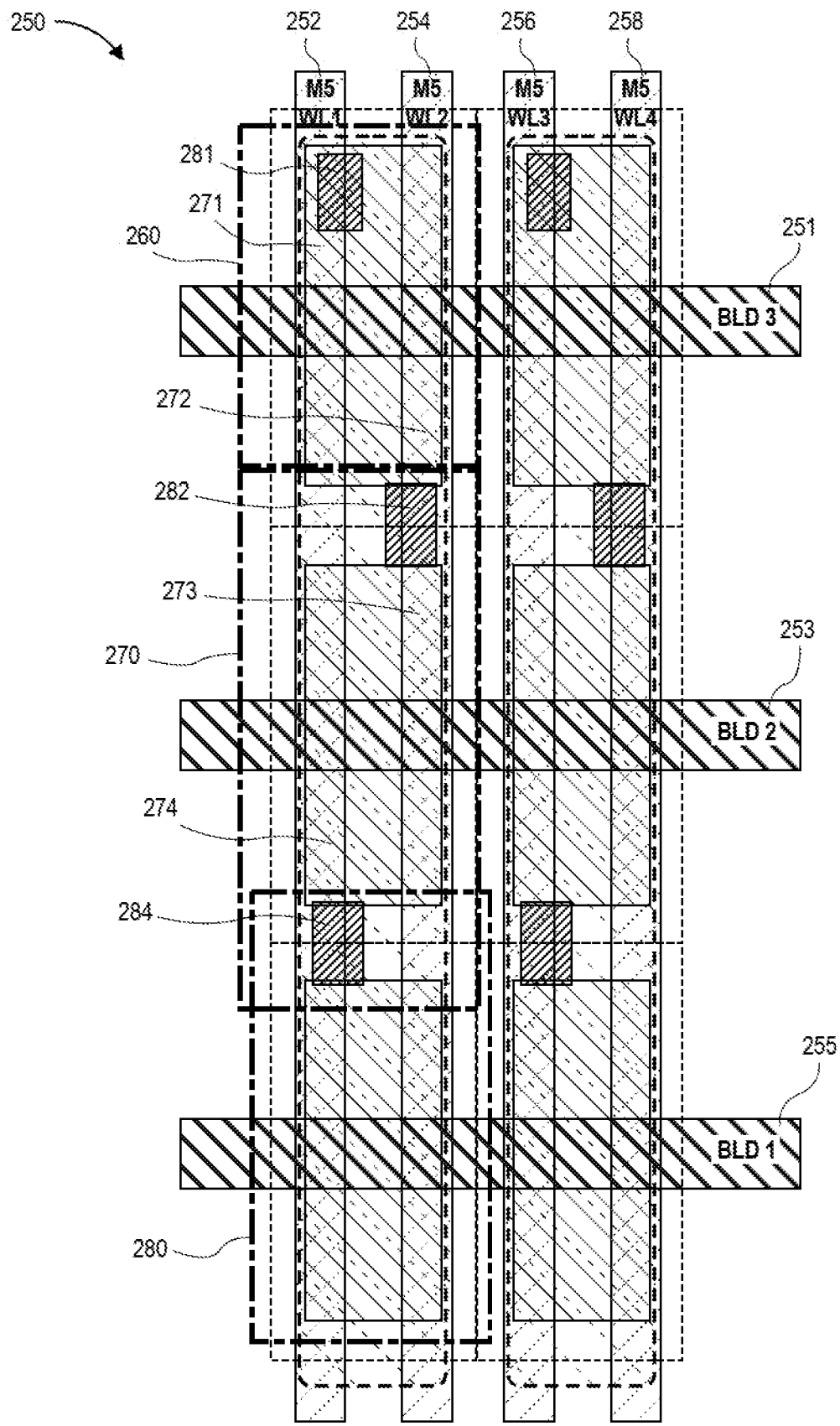

FIGS. 2(a)-2(b) schematically illustrate diagrams of a memory device including at least two memory cells with a shared contact electrode coupled to a bit line of the memory device, in accordance with some embodiments. FIG. 2(a) illustrates a memory device 200 including multiple memory cells organized in pairs, e.g., a pair of memory cells 210, a pair of memory cells 220, a pair of memory cells 230, and more, formed over a bit line 201, a bit line 203, and a bit line 205, a word line 202, a word line 204, a word line 206, and a word line 208. FIG. 2(b) illustrates a memory device 250 including multiple memory cells organized in pairs, e.g., a pair of memory cells 260, a pair of memory cells 270, a pair of memory cells 280, and more, formed over a bit line 251, a bit line 253, and a bit line 255, a word line 252, a word line 254, a word line 256, and a word line 258. Each of the pairs of memory cells, e.g., 210, 220, 230, 260, 270, or 280 is an example of the memory device 100 as shown in FIGS. 1(a)-1(c).

In embodiments, as shown in FIG. 2(a), the pair of memory cells 210 includes a first memory cell and a second memory cell formed at BEOL. The first memory cell includes a first storage cell and a first transistor having a gate electrode 221 to control access to the first storage cell. The second memory cell includes a second storage cell and a second transistor having a gate electrode 222 to control access to the second storage cell. In some embodiments, the first storage cell or the second storage cell may be a capacitor. The first transistor includes the gate electrode 221, a first contact electrode, and a shared contact electrode coupled to the bit line 201. The gate electrode 221 is coupled to the word line 202 by a via or a short via 231. The second transistor includes the gate electrode 222, a second contact electrode, and the shared contact electrode coupled to the bit line 201. The gate electrode 222 is coupled to the word line 204 by a via or a short via 232. The shared contact electrode is coupled to a source area or a drain area of the first transistor, and is coupled to a source area or a drain area of the second transistor, and further being coupled to the bit line 201 through a via, as shown in FIGS. 1(a)-1(c).

In embodiments, similarly, the pair of memory cells 220 includes a third memory cell and a fourth memory cell formed at BEOL. The third memory cell includes a third storage cell and a third transistor having a gate electrode 223 to control access to the third storage cell. The fourth memory cell includes a fourth storage cell and a fourth transistor having a gate electrode 224 to control access to the fourth storage cell. In some embodiments, the third storage cell or the fourth storage cell may be a capacitor. The third transistor includes the gate electrode 223, a third contact electrode, and a shared contact electrode coupled to the bit line 203. The gate electrode 223 is coupled to the word line 204 by a via or a short via 233. The fourth transistor includes the gate electrode 224, a fourth contact electrode, and the shared contact electrode coupled to the bit line 203. The gate electrode 224 is coupled to the word line 202 by a via or a short via 234. The shared contact electrode is coupled to a source area or a drain area of the third transistor, and is coupled to a source area or a drain area of the fourth transistor, and further being coupled to the bit line 203 through a via, as shown in FIGS. 1(a)-1(c).

In embodiments, as shown in FIG. 2(b), the pair of memory cells 260 includes a first memory cell and a second memory cell formed at BEOL. The first memory cell includes a first storage cell and a first transistor having a gate electrode 271 to control access to the first storage cell. The second memory cell includes a second storage cell and a second transistor having a gate electrode 272 to control access to the second storage cell. The first transistor includes the gate electrode 271, a first contact electrode, and a shared contact electrode coupled to the bit line 251. The gate electrode 271 is coupled to the word line 252 by a via or a short via 281. The second transistor includes the gate electrode 272, a second contact electrode, and the shared contact electrode coupled to the bit line 251. The gate electrode 272 is coupled to the word line 254 by a via or a short via 282.

Furthermore, the via or a short via 282 may be shared by the pair of memory cells 270. In detail, the pair of memory cells 270 includes a third memory cell and a fourth memory cell. The third memory cell includes a third storage cell and a third transistor having a gate electrode 273 to control access to the third storage cell. The fourth memory cell includes a fourth storage cell and a fourth transistor having a gate electrode 274 to control access to the fourth storage cell. The third transistor includes the gate electrode 273, a third contact electrode, and a shared contact electrode coupled to the bit line 253. The gate electrode 273 is coupled to the word line 254 by the shared via or short via 282. In some embodiments, the gate electrode 273 of the pair of memory cells 270 and the gate electrode 272 of the pair of memory cells 260 may be one piece of continuous gate electrode. The fourth transistor includes the gate electrode 274, a fourth contact electrode, and the shared contact electrode coupled to the bit line 253. The gate electrode 274 is coupled to the word line 252 by a via or a short via 284. The gate electrode 273 and the gate electrode 272 is another shared contact electrode that is shared between the second transistor and the third transistor, and further coupled to the word line 254.

Figure 3:
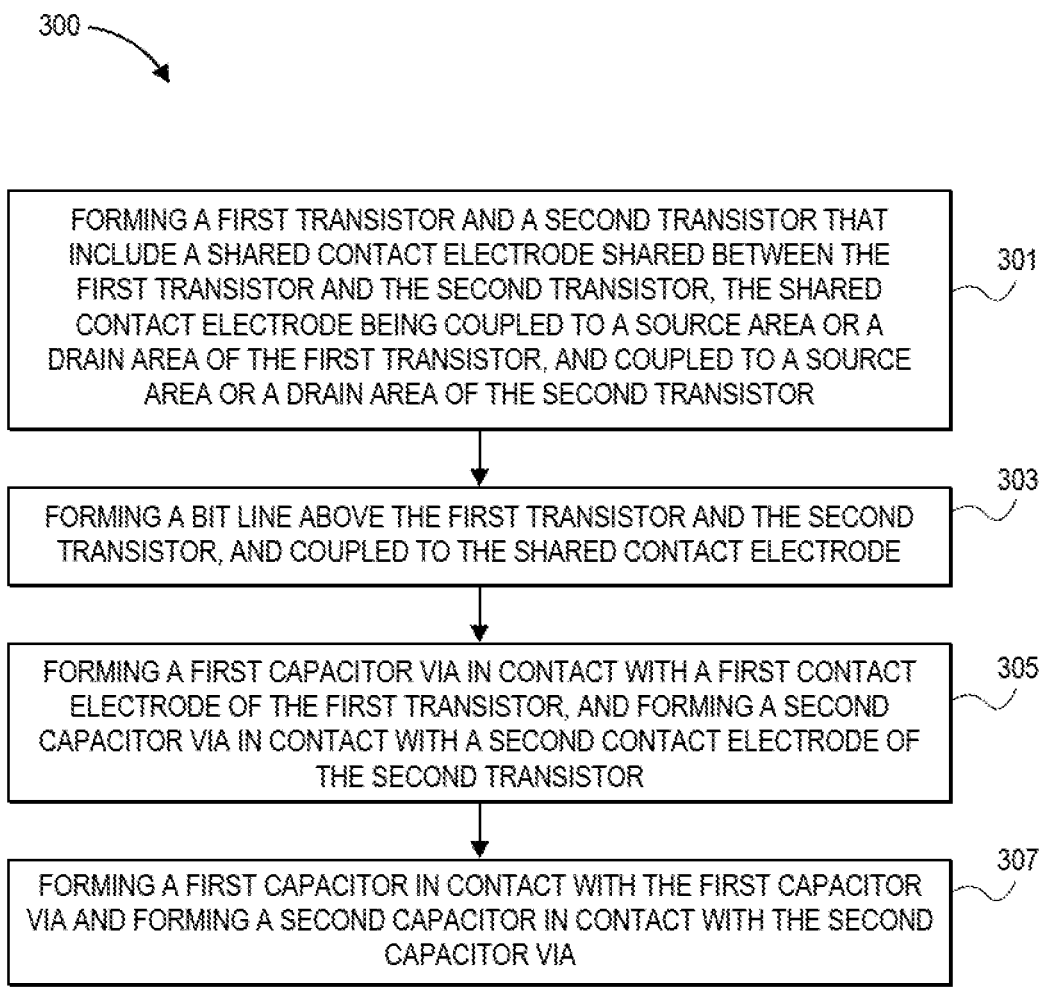
FIG. 3 illustrates a process for forming a memory device including at least two memory cells with a shared contact electrode coupled to a bit line of the memory device, in accordance with some embodiments.
Figure 4A:
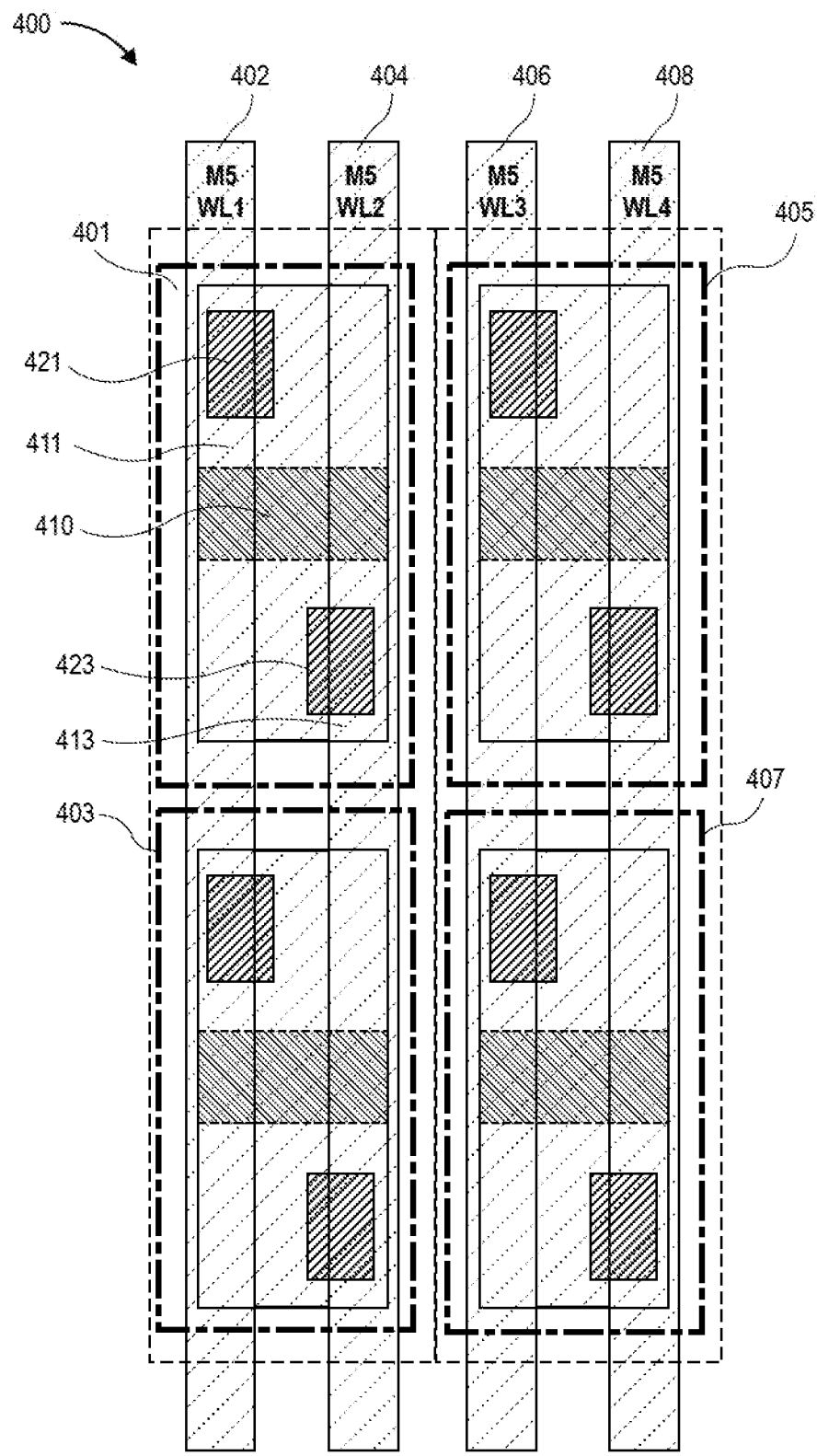
FIGS. 4(a)-4(c) schematically illustrate a process for forming a memory device including at least two memory cells with a shared contact electrode coupled to a bit line of the memory device, in accordance with some embodiments.
Figure 4B:
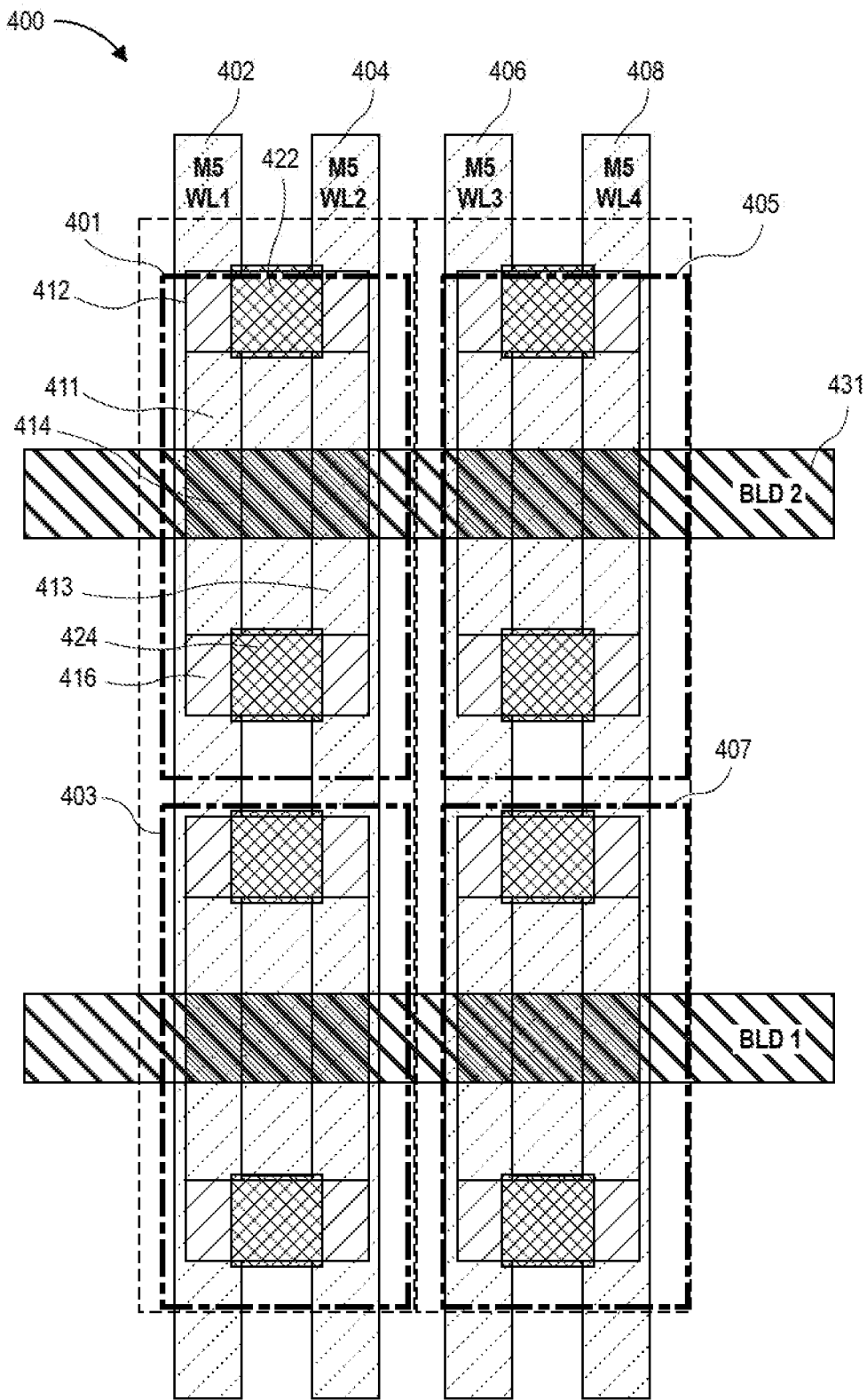
Figure 4C:
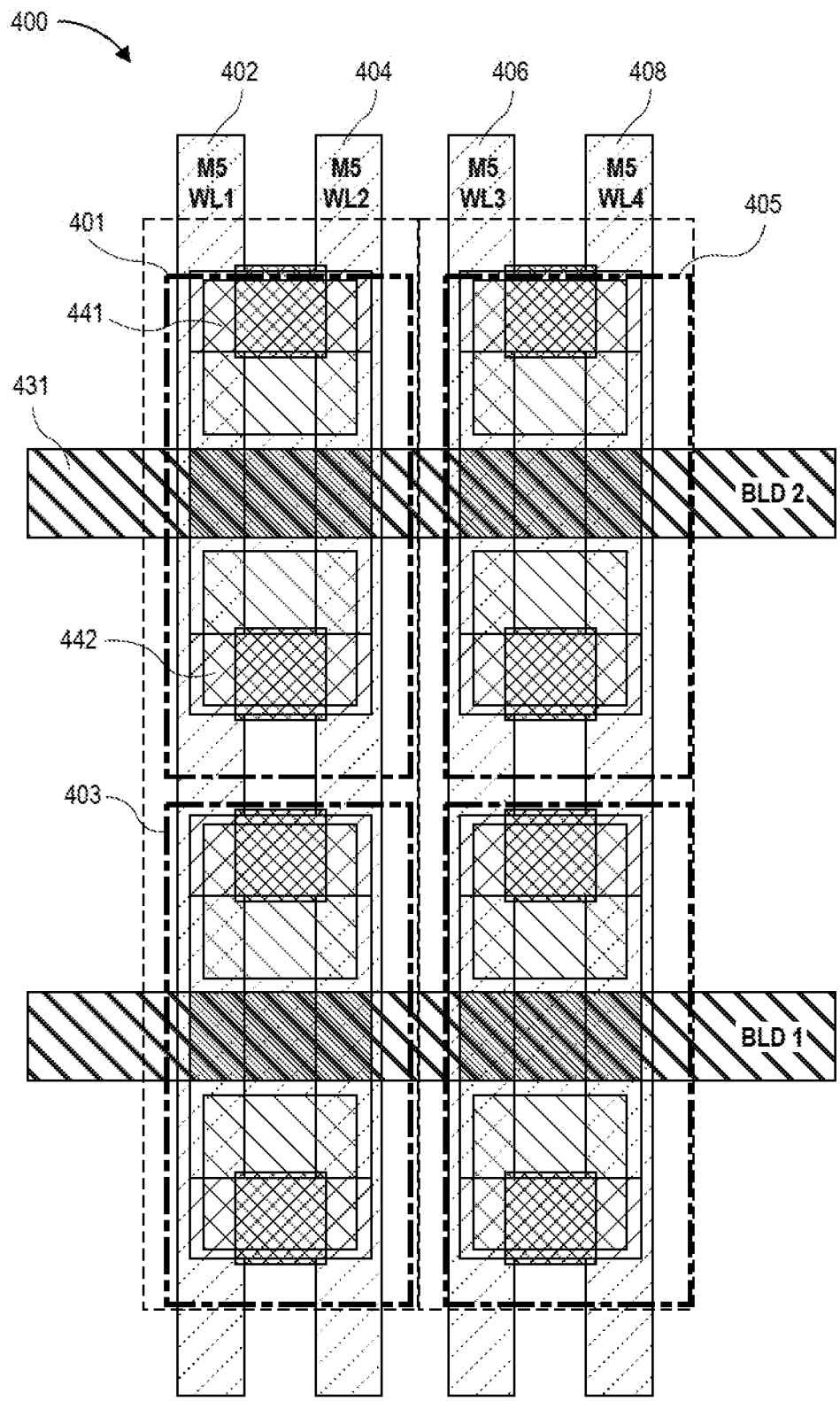

FIG. 3 illustrates a process 300 for forming a memory device including at least two memory cells with a shared contact electrode coupled to a bit line of the memory device, in accordance with some embodiments. FIGS. 4(a)-4(c) schematically illustrate the process 300 for forming a memory device 400 including at least two memory cells with a shared contact electrode coupled to a bit line of the memory device. In embodiments, the process 300 may be applied to form the memory device 100 including the first memory cell 151 and the second memory cell 154, with the shared contact electrode 101 coupled to the bit line 132, as shown in FIGS. 1(a)-1(c).

At block 301, the process 300 includes forming a first transistor and a second transistor that include a shared contact electrode shared between the first transistor and the second transistor, the shared contact electrode being coupled to a source area or a drain area of the first transistor, and coupled to a source area or a drain area of the second transistor. In detail, the first transistor includes a first gate electrode, a first contact electrode, and the shared contact electrode. The first gate electrode is coupled to a first word line by a first via. The second transistor includes a second gate electrode, a second contact electrode, and the shared contact electrode. The second gate electrode is coupled to a second word line by a second via. For example, as shown in FIGS. 4(a) and 4(b), the memory device 400 includes multiple pairs of memory cells, e.g., a pair of memory cells 401, a pair of memory cells 403, a pair of memory cells 405, and a pair of memory cells 407, to be coupled to a word line 402, a word line 404, a word line 406, and a word line 408. A pair of memory cells, e.g., the pair of memory cells 401 includes two memory cells, a first memory cell and a second memory cell, similar to the memory device 100. The first memory cell includes a first storage cell and a first transistor having a gate electrode to control access to the first storage cell. The second memory cell includes a second storage cell and a second transistor having a gate electrode to control access to the second storage cell. As shown in FIGS. 4(a) and 4(b), the first transistor and the second transistor are formed. In detail, the first transistor includes a first gate electrode 411, a first contact electrode 412, and a shared contact electrode 414. The first gate electrode 411 is coupled to the word line 402 by a via 421. The second transistor includes a second gate electrode 413, a second contact electrode 416, and the shared contact electrode 414. The second gate electrode 413 is coupled to the word line 404 by a via 423. A shared channel 410 is formed and shared between the first transistor and the second transistor.

At block 303, the process 300 may include forming a bit line above the first transistor and the second transistor, and coupled to the shared contact electrode. At block 305, the process 300 may include forming a first capacitor via in contact with the first contact electrode and forming a second capacitor via in contact with the second contact electrode. For example, as shown in FIG. 4(b), a bit line 431 is formed above the first transistor and the second transistor, and coupled to the shared contact electrode 414. A capacitor via 422 is formed in contact with the first contact electrode 412, a capacitor via 424 is formed in contact with the second contact electrode 416.

At block 307, the process 300 may include forming a first capacitor in contact with the first capacitor via and forming a second capacitor in contact with the second capacitor via. For example, as shown in FIG. 4(c), a capacitor 441 is formed in contact with the capacitor via 422, and a capacitor 442 is formed in contact with the capacitor via 416.

Figure 5:
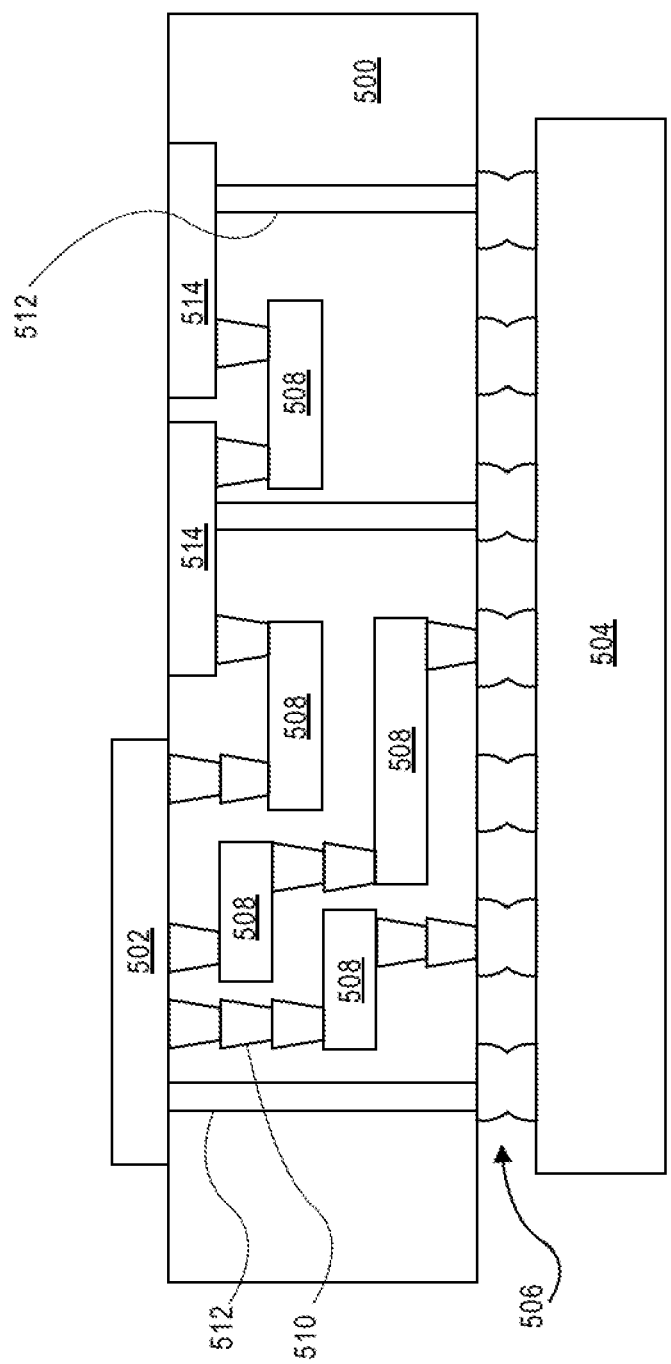
FIG. 5 schematically illustrates an interposer implementing one or more embodiments of the disclosure, in accordance with some embodiments.

FIG. 5 illustrates an interposer 500 that includes one or more embodiments of the disclosure. The interposer 500 is an intervening substrate used to bridge a first substrate 502 to a second substrate 504. The first substrate 502 may be, for instance, a substrate support for memory devices with multiple memory cells, e.g., the memory device 100 as shown in FIGS. 1(a)-1(c), the memory device 200 as shown in FIG. 2(a), the memory device 250 as shown in FIG. 2(b), and the memory device 400 as shown in FIGS. 4(a)-4(c). The second substrate 504 may be, for instance, a memory module, a computer motherboard, or another integrated circuit die. For example, the second substrate 504 may be a memory module including the memory device 100 as shown in FIGS. 1(a)-1(c), the memory device 200 as shown in FIG. 2(a), the memory device 250 as shown in FIG. 2(b), and the memory device 400 as shown in FIGS. 4(a)-4(c). Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, and other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

Figure 6:
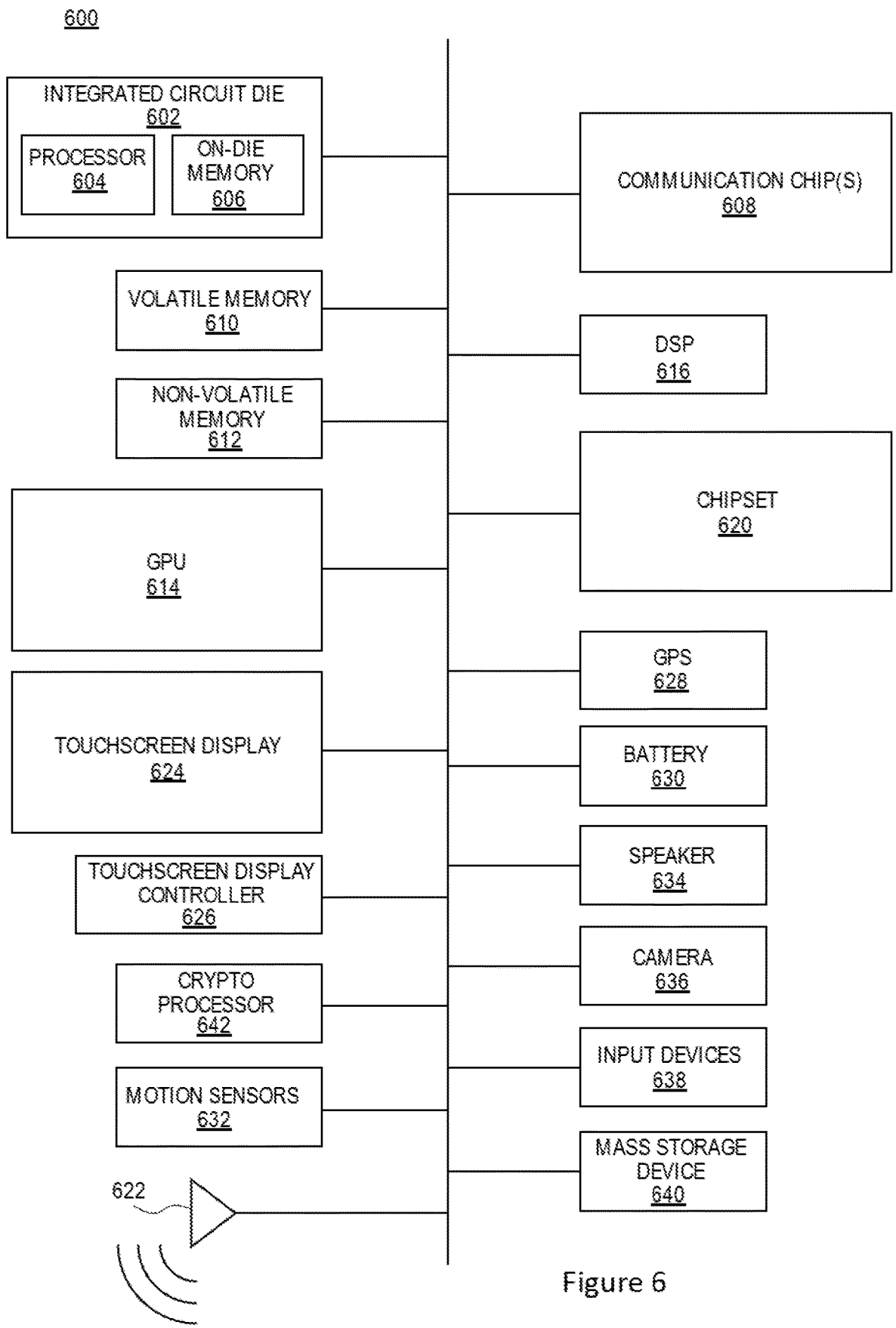
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606 may include the memory device 100 as shown in FIGS. 1(a)-1(c), the memory device 200 as shown in FIG. 2(a), the memory device 250 as shown in FIG. 2(b), and the memory device 400 as shown in FIGS. 4(a)-4(c).

In embodiments, the computing device 600 may include a display or a touchscreen display 624, and a touchscreen display controller 626. A display or the touchscreen display 624 may include a FPD, an AMOLED display, a TFT LCD, a micro light-emitting diode (µLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure, e.g., the memory device 100 as shown in FIGS. 1(*a*)-1(*c*), the memory device 200 as shown in FIG. 2(*a*), the memory device 250 as shown in FIG. 2(*b*), and the memory device 400 as shown in FIGS. 4(*a*)-4(*c*).

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some Non-Limiting Examples are Provided Below.

Example 1 may include a memory device, comprising: a first memory cell including a first storage cell and a first transistor to control access to the first storage cell; a second memory cell including a second storage cell and a second transistor to control access to the second storage cell; and a shared contact electrode that is shared between the first transistor and the second transistor, the shared contact electrode being coupled to a source area or a drain area of the first transistor, and coupled to a source area or a drain area of the second transistor, and further being coupled to a bit line of the memory device.

Example 2 may include the memory device of example 1 and/or some other examples herein, wherein the first transistor further includes a first gate electrode coupled to a first word line, and the second transistor further includes a second gate electrode coupled to a second word line.

Example 3 may include the memory device of example 2 and/or some other examples herein, wherein the first word line and the second word line are located in a same metal layer at back end of the line.

Example 4 may include the memory device of example 2 and/or some other examples herein, wherein the first gate electrode is coupled to the first word line by a first short via, and the second gate electrode is coupled to the second word line by a second short via.

Example 5 may include the memory device of example 2 and/or some other examples herein, wherein the shared contact electrode is located in a first metal layer, and the first gate electrode or the second gate electrode is located in a second metal layer, and the second metal layer is separated from the first metal layer by an ILD layer.

Example 6 may include the memory device of example 5 and/or some other examples herein, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

Example 7 may include the memory device of example 2 and/or some other examples herein, wherein the first transistor further includes a first channel area separating the shared contact electrode and the first gate electrode, the second transistor further includes a second channel area separating the shared contact electrode and the second gate electrode, and wherein the first channel area and the second channel area form a continuous channel area.

Example 8 may include the memory device of example 7 and/or some other examples herein, wherein the continuous channel area includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 9 may include the memory device of example 2 and/or some other examples herein, wherein the first transistor further includes a first contact electrode coupled to the source area or the drain area of the first transistor, the first memory cell includes a first capacitor, and the first contact electrode is coupled to a first plate within the first capacitor; and the second transistor further includes a second contact electrode coupled to the source area or the drain area of the second transistor, the second memory cell includes a second capacitor, and the second contact electrode is coupled to a second plate within the second capacitor.

Example 10 may include the memory device of example 9 and/or some other examples herein, wherein the first capacitor further includes a third plate separated from the first plate by a first dielectric material, the second capacitor further includes a fourth plate separated from the second plate by a second dielectric material, and the third plate and the fourth plate are coupled together.

Example 11 may include the memory device of example 1 and/or some other examples herein, wherein the first memory cell and the second memory cell are within an interconnect structure that is above a substrate.

Example 12 may include the memory device of example 1 and/or some other examples herein, wherein the shared contact electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, InOx, HfOx, AlOx, or InAlO.

Example 13 may include the memory device of example 1 and/or some other examples herein, wherein the shared contact electrode is a first shared contact electrode, and the memory device further comprises: a third memory cell including a third storage cell and a third transistor to control access to the third storage cell; and a second shared contact electrode that is shared between the first transistor and the third transistor, wherein the second shared contact electrode is a gate electrode for the first transistor, and also a gate electrode for the third transistor, and the second shared contact electrode is coupled to a word line of the memory array.

Example 14 may include a memory device, comprising: a first transistor including a first gate electrode, a first contact electrode, and a shared contact electrode, wherein the shared contact electrode is coupled to a source area or a drain area of the first transistor, and further coupled to a bit line, and the first gate electrode is coupled to a first word line; a second transistor including a second gate electrode, a second contact electrode, and the shared contact electrode, wherein the shared contact electrode is coupled to a source area or a drain area of the second transistor, the second gate electrode is coupled to a second word line; a channel layer shared between the first transistor and the second transistor, wherein the first gate electrode and the second gate electrode are located at a first side of the channel layer, and the first contact electrode, the shared contact electrode, and the second contact electrode are located at a second side of the channel layer opposite to the first side; a first capacitor coupled to the first contact electrode; and a second capacitor coupled to the second contact electrode, wherein the first transistor and the first capacitor form a first memory cell, and the second transistor and the second capacitor form a second memory cell.

Example 15 may include the memory device of example 14 and/or some other examples herein, wherein the first contact electrode is coupled to the source area or the drain area of the first transistor, the second contact electrode is coupled to the source area or the drain area of the second transistor, the first capacitor includes a first plate and a second plate separated from the first plate by a first dielectric material, the second capacitor includes a third plate and a fourth plate separated from the third plate by a second dielectric material, and the second plate and the fourth plate are coupled together.

Example 16 may include the memory device of example 14 and/or some other examples herein, wherein the channel layer includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 17 may include the memory device of example 14 and/or some other examples herein, wherein the shared contact electrode is located in a first metal layer, and the first gate electrode or the second gate electrode is located in a second metal layer, and the second metal layer is separated from the first metal layer by an ILD layer, and wherein the first word line and the second word line are located in a same metal layer at back end of the line.

Example 18 may include a method for forming a memory device, comprising: forming a first transistor and a second transistor, wherein the first transistor includes a first gate electrode, a first contact electrode, and a shared contact electrode, wherein the shared contact electrode is coupled to a source area or a drain area of the first transistor, and the first gate electrode is coupled to a first word line by a first via, and wherein the second transistor includes a second gate electrode, a second contact electrode, and the shared contact electrode, wherein the shared contact electrode is coupled to a source area or a drain area of the second transistor, the second gate electrode is coupled to a second word line by a second via; forming a bit line above the first transistor and the second transistor, and coupled to the shared contact electrode; forming a first capacitor via in contact with the first contact electrode, and forming a second capacitor via in contact with the second contact electrode; and forming a first capacitor in contact with the first capacitor via, and forming a second capacitor in contact with the second capacitor via.

Example 19 may include the method of example 18 and/or some other examples herein, wherein the first transistor further includes a first channel area separating the shared contact electrode and the first gate electrode, the second transistor further includes a second channel area separating the shared contact electrode and the second gate electrode, and wherein the first channel area and the second channel area form a continuous channel area.

Example 20 may include the method of example 18 and/or some other examples herein, wherein the first word line and the second word line are located in a same metal layer at back end of the line.

Example 21 may include a computing device, comprising: a circuit board; and a memory device coupled to the circuit board and including a memory array, wherein the memory array includes: a first memory cell including a first storage cell and a first transistor to control access to the first storage cell; a second memory cell including a second storage cell and a second transistor to control access to the second storage cell; and a shared contact electrode that is shared between the first transistor and the second transistor, the shared contact electrode being coupled to a source area or a drain area of the first transistor, and coupled to a source area or a drain area of the second transistor, and further being coupled to a bit line of the memory array.

Example 22 may include the computing device of example 21 and/or some other examples herein, wherein the first transistor further includes a first gate electrode coupled to a first word line, and the second transistor further includes a second gate electrode coupled to a second word line.

Example 23 may include the computing device of example 22 and/or some other examples herein, wherein the first transistor further includes a first channel area separating the shared contact electrode and the first gate electrode, the second transistor further includes a second channel area separating the shared contact electrode and the second gate electrode, and wherein the first channel area and the second channel area form a continuous channel area.

Example 24 may include the computing device of example 21 and/or some other examples herein, wherein the shared contact electrode is a first shared contact electrode, and the memory device further comprises: a third memory cell including a third storage cell and a third transistor to control access to the third storage cell; and a second shared contact electrode that is shared between the first transistor and the third transistor, wherein the second shared contact electrode is a gate electrode for the first transistor, and also a gate electrode for the third transistor, and the second shared contact electrode is coupled to a word line of the memory array.

Example 25 may include the computing device of example 21 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A memory device, comprising:
a first memory cell including a first storage cell and a first transistor to control access to the first storage cell;
a second memory cell including a second storage cell and a second transistor to control access to the second storage cell; and
a shared contact electrode that is shared between the first transistor and the second transistor, the shared contact electrode being coupled to a source area or a drain area of the first transistor, and coupled to a source area or a drain area of the second transistor, and further being coupled to a bit line of the memory device, wherein the shared contact is on a side of a first channel area and a second channel area opposite a first gate electrode and a second gate electrode of the first and second transistors, respectively, and wherein the first transistor further includes the first gate electrode coupled to a first word line, and the second transistor further includes the second gate electrode coupled to a second word line.

2. The memory device of claim 1, wherein the first word line and the second word line are located in a same metal layer at back end of the line.

3. The memory device of claim 1, wherein the first gate electrode is coupled to the first word line by a first short via, and the second gate electrode is coupled to the second word line by a second short via.

4. The memory device of claim 1, wherein the shared contact electrode is located in a first metal layer, and the first gate electrode or the second gate electrode is located in a second metal layer, and the second metal layer is separated from the first metal layer by an ILD layer.

5. The memory device of claim 4, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

6. The memory device of claim 1, wherein the first transistor further includes the first channel area separating the shared contact electrode and the first gate electrode, the second transistor further includes the second channel area separating the shared contact electrode and the second gate electrode, and wherein the first channel area and the second channel area form a continuous channel area.

7. The memory device of claim 6, wherein the continuous channel area includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

8. The memory device of claim 1, wherein the first transistor further includes a first contact electrode coupled to the source area or the drain area of the first transistor, the first memory cell includes a first capacitor, and the first contact electrode is coupled to a first plate within the first capacitor; and the second transistor further includes a second contact electrode coupled to the source area or the drain area of the second transistor, the second memory cell includes a second capacitor, and the second contact electrode is coupled to a second plate within the second capacitor.

9. The memory device of claim 8, wherein the first capacitor further includes a third plate separated from the first plate by a first dielectric material, the second capacitor further includes a fourth plate separated from the second plate by a second dielectric material, and the third plate and the fourth plate are coupled together.

10. The memory device of claim 1, wherein the first memory cell and the second memory cell are within an interconnect structure that is above a substrate.

11. The memory device of claim 1, wherein the shared contact electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, InOx, HfOx, AlOx, or InAlO.

12. The memory device of claim 1, wherein the shared contact electrode is a first shared contact electrode, and the memory device further comprises:
a third memory cell including a third storage cell and a third transistor to control access to the third storage cell; and
a second shared contact electrode that is shared between the first transistor and the third transistor.

13. A memory device, comprising:
a first transistor including a first gate electrode, a first contact electrode, and a shared contact electrode, wherein the shared contact electrode is coupled to a source area or a drain area of the first transistor, and further coupled to a bit line, and the first gate electrode is coupled to a first word line;
a second transistor including a second gate electrode, a second contact electrode, and the shared contact electrode, wherein the shared contact electrode is coupled to a source area or a drain area of the second transistor, the second gate electrode is coupled to a second word line;
a channel layer shared between the first transistor and the second transistor, wherein the first gate electrode and the second gate electrode are located at a first side of the channel layer, and the first contact electrode, the shared contact electrode, and the second contact electrode are located at a second side of the channel layer opposite to the first side;
a first capacitor coupled to the first contact electrode; and
a second capacitor coupled to the second contact electrode, wherein the first transistor and the first capacitor form a first memory cell, and the second transistor and the second capacitor form a second memory cell.

14. The memory device of claim 13, wherein the first contact electrode is coupled to the source area or the drain area of the first transistor, the second contact electrode is coupled to the source area or the drain area of the second transistor,
the first capacitor includes a first plate and a second plate separated from the first plate by a first dielectric material, the second capacitor includes a third plate and a fourth plate separated from the third plate by a second dielectric material, and the second plate and the fourth plate are coupled together.

15. The memory device of claim 13, wherein the channel layer includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

16. The memory device of claim 13, wherein the shared contact electrode is located in a first metal layer, and the first gate electrode or the second gate electrode is located in a second metal layer, and the second metal layer is separated from the first metal layer by an ILD layer, and wherein the first word line and the second word line are located in a same metal layer at back end of the line.

17. A method for forming a memory device, comprising:
forming a first transistor and a second transistor, wherein the first transistor includes a first gate electrode, a first contact electrode, and a shared contact electrode, wherein the shared contact electrode is coupled to a source area or a drain area of the first transistor, and the first gate electrode is coupled to a first word line by a first via, and wherein the second transistor includes a second gate electrode, a second contact electrode, and the shared contact electrode, wherein the shared contact electrode is coupled to a source area or a drain area of the second transistor, the second gate electrode is coupled to a second word line by a second via, wherein the shared contact electrode is on a side of a first channel area and a second channel area opposite the first gate electrode and the second gate electrode of the first and second transistors, respectively;
forming a bit line above the first transistor and the second transistor, and coupled to the shared contact electrode;

forming a first capacitor via in contact with the first contact electrode, and forming a second capacitor via in contact with the second contact electrode; and forming a first capacitor in contact with the first capacitor via, and forming a second capacitor in contact with the second capacitor via.

18. The method of claim 17, wherein the first transistor further includes the first channel area separating the shared contact electrode and the first gate electrode, the second transistor further includes the second channel area separating the shared contact electrode and the second gate electrode, and wherein the first channel area and the second channel area form a continuous channel area.

19. The method of claim 17, wherein the first word line and the second word line are located in a same metal layer at back end of the line.

20. A computing device, comprising:
a circuit board; and
a memory device coupled to the circuit board and including a memory array, wherein the memory array includes:
a first memory cell including a first storage cell and a first transistor to control access to the first storage cell;
a second memory cell including a second storage cell and a second transistor to control access to the second storage cell; and
a shared contact electrode that is shared between the first transistor and the second transistor, the shared contact electrode being coupled to a source area or a drain area of the first transistor, and coupled to a source area or a drain area of the second transistor, and further being coupled to a bit line of the memory array, wherein the shared contact is on a side of a first channel area and a second channel area opposite a first gate electrode and a second gate electrode of the first and second transistors, respectively, wherein the first transistor further includes the first gate electrode coupled to a first word line, and the second transistor further includes the second gate electrode coupled to a second word line.

21. The computing device of claim 20, wherein the first transistor further includes the first channel area separating the shared contact electrode and the first gate electrode, the second transistor further includes the second channel area separating the shared contact electrode and the second gate electrode, and wherein the first channel area and the second channel area form a continuous channel area.

22. The computing device of claim 20, wherein the shared contact electrode is a first shared contact electrode, and the memory device further comprises:
a third memory cell including a third storage cell and a third transistor to control access to the third storage cell; and
a second shared contact electrode that is shared between the first transistor and the third transistor.

23. The computing device of claim 20, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

* * * * *